(12) United States Patent
Lee et al.

(10) Patent No.: US 9,497,448 B2
(45) Date of Patent: Nov. 15, 2016

(54) IMAGE PROCESSING METHOD OF TRANSPARENT DISPLAY APPARATUS AND APPARATUS THEREOF

(71) Applicant: LG Display Co., Ltd., Seoul (KR)

(72) Inventors: SangLyn Lee, Goyang-si (KR);
JungHoon Seo, Goyang-si (KR);
JooYoung An, Pyeongtaek-si (KR);
Jung-Gyum Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 333 days.

(21) Appl. No.: 14/140,200

(22) Filed: Dec. 24, 2013

(65) Prior Publication Data

US 2014/0184758 A1 Jul. 3, 2014

(30) Foreign Application Priority Data

Dec. 31, 2012 (KR) ........................ 10-2012-0157800

(51) Int. Cl.
*H04N 13/04* (2006.01)
*H04N 13/00* (2006.01)
*H01L 51/52* (2006.01)

(52) U.S. Cl.
CPC ...... *H04N 13/0495* (2013.01); *H01L 51/5281* (2013.01); *H04N 13/0018* (2013.01)

(58) Field of Classification Search
CPC .................................................. H04N 13/0495
See application file for complete search history.

(56) References Cited

U.S. PATENT DOCUMENTS

| 6,417,969 B1 | 7/2002 | De Luca et al. |
| 6,906,762 B1 | 6/2005 | Witehira et al. |
| 2004/0246267 A1* | 12/2004 | Oohara ............... G09G 5/02 345/591 |
| 2006/0132671 A1* | 6/2006 | Koma ............. G02F 1/133512 349/63 |

(Continued)

FOREIGN PATENT DOCUMENTS

| CN | 101938670 A | 1/2011 |
| EP | 1217584 A2 | 6/2002 |

(Continued)

OTHER PUBLICATIONS

PCT International Search Report for PCT/KR2013/012284, Apr. 24, 2014, 3 Pages.

(Continued)

*Primary Examiner* — Peter D Le
(74) *Attorney, Agent, or Firm* — Fenwick & West LLP

(57) ABSTRACT

There are provided an image processing method. Perspective is calculated from an image, the image is divided into a plurality of objects in consideration of the perspective, and processing levels of the plurality of objects are assigned. A light shielding rate of a transparent display apparatus is calculated based on the processing levels. Further, image processing is performed on the objects on the basis of the processing levels, so that it is possible to improve a stereoscopic effect being felt while using the transparent display apparatus. Furthermore, a shielding rate of light entering from the rear side of the transparent display apparatus is effectively adjusted, and the image is processed to improve the visibility of the image.

19 Claims, 12 Drawing Sheets

(56) References Cited

U.S. PATENT DOCUMENTS

| | | | |
|---|---|---|---|
| 2009/0167979 A1* | 7/2009 | Watanabe | G02F 1/133308 349/58 |
| 2009/0244834 A1* | 10/2009 | Sugimori | H04M 19/04 361/679.55 |
| 2010/0119149 A1 | 5/2010 | Hong et al. | |
| 2011/0018976 A1* | 1/2011 | Park | H04N 13/0018 348/51 |
| 2011/0157257 A1* | 6/2011 | Bennett | G06F 3/14 345/690 |
| 2012/0075291 A1 | 3/2012 | Sohn | |
| 2012/0121138 A1 | 5/2012 | Fedorovskaya et al. | |
| 2012/0154557 A1 | 6/2012 | Perez et al. | |
| 2012/0242724 A1 | 9/2012 | Kurozuka et al. | |
| 2013/0147696 A1* | 6/2013 | Penttila | G09G 3/342 345/85 |

FOREIGN PATENT DOCUMENTS

| | | |
|---|---|---|
| JP | 08-136884 A | 5/1996 |
| JP | 2003-005128 A | 1/2003 |
| KR | 10-2012-0032321 A | 4/2012 |

OTHER PUBLICATIONS

Supplementary European Search Report for European Patent Application No. EP 13867210, Jun. 13, 2016, 9 Pages.

Office Action for Chinese Patent Application No. CN 201380069514.6, Jul. 29, 2016, 23 Pages.

\* cited by examiner

IMAGE PROCESSING METHOD OF TRANSPARENT DISPLAY APPARATUS AND APPARATUS THEREOF

CROSS-REFERENCE TO RELATED APPLICATIONS

This application claims the priority of Korean Patent Application No. 10-2012-0157800 filed on Dec. 31, 2012, in the Korean Intellectual Property Office, the disclosure of which is incorporated herein by reference in its entirety.

BACKGROUND OF THE INVENTION

1. Field of the Invention

The present invention relates to a transparent display apparatus and a method for controlling the same, and more particularly, to a transparent display apparatus and a method forgiving a stereoscopic effect to an image displayed on the transparent display apparatus.

2. Description of the Related Art

Transparent display apparatus allows the user to see both the image displayed from the display apparatus and the background view behind the display apparatus. Attempts have been made to provide such transparent display apparatus with a liquid-crystal display (LCD). However, the two polarizing plates included in the liquid-crystal display significantly reduced the transmittance rate through the display device. In addition, the back-light unit and/or various optical sheets, such as a diffuser sheet or a prism sheet, made it extremely difficult to obtain sufficient transparency through the LCD based transparent display device.

Display devices employing organic light-emitting diode (OLED) do not require such polarizing plates as the LCD display device. Also the back-light unit is not required as the OLED is a self-emissive device. For these reasons, the OLED based display device is considered as the promising component in implementing a transparent display apparatus.

A transparent display is a display that shows a view behind of a display through the display itself. When using the transparent display apparatus, the user recognizes the image as a front space and the view behind the display apparatus as a back space. That is, the user recognizes the depth of two different spaces. This makes the transparent display apparatus a suitable display device for displaying contents having stereoscopic effect, for example, augmented reality contents or any interactive contents incorporating the surrounding environment. On the other hand, when the amount of the external light through the display apparatus is greater than amount of the light of the image displayed by the device itself, the quality of the image is degraded. In other words, a contrast ratio and a color saturation of the image are reduced by the view, which is essentially the external light ray from the rear side of the transparent display apparatus, thereby making it difficult for the user to recognize the depth of the individual objects of the image. That is, the quality of the image is degraded in terms of stereoscopic effect.

Even with such improvement in transparency, there remains a challenge in providing a transparent display apparatus capable of providing improved user experience.

SUMMARY OF THE INVENTION

The inventors of the present invention have found that the image quality and transparency of the transparent display apparatus can be improved by selectively applying stereoscopic effects to the image.

Accordingly, an aspect of the present invention relates to an image processing method for applying stereoscopic effects to the image. In an embodiment, the image is divided into a plurality of objects in consideration of the depth of each object, and processing levels of the plurality of objects are assigned. A light shielding rate of a transparent display apparatus is controlled based on the processing levels. Further, image processing is performed on the objects on the basis of the processing levels, so that it is possible to improve a stereoscopic effect. Furthermore, a shielding rate of light entering from the rear side of the transparent display apparatus is effectively adjusted, and the image is processed to improve the visibility of the image.

In another aspect, the present invention relates to a transparent display apparatus for providing stereoscopic effects. In an embodiment, the transparent display apparatus includes a transparent display unit, a light shielding unit, and a processing unit. The transparent display unit displays an image. The light shielding unit adjusts a shielding rate of an area of the light shielding unit corresponding to the transparent display unit. The processing unit divides the image into a plurality of objects, performs imaging processing on at least one object of the plurality of objects, and controls light shielding rates of the objects. Accordingly, the stereoscopic effect for the objects is improved.

In some embodiments, a transparent display apparatus including plurality of sub pixels with an emissive area and a transmissive area. The transparent display apparatus is capable of achieving good transmittance through the transmissive area. The transparent display apparatus allows a user to see a view behind of the display through the transmissive area and an image emitted from the emissive area simultaneously. The effects according to the present invention are not limited to the aforementioned effects, but various effects are included in the present specification.

In one embodiment, a transparent display apparatus comprises a transparent display unit having light emitting material for display of an image, the transparent display unit being transparent to external light incident on the transparent display apparatus. The transparent display apparatus includes a light shielding unit that shields at least a portion of the external light from passing through the transparent display unit. The transparent display apparatus also includes at least one processing unit to determine a first processing level corresponding to a target emphasis for a first object in the image; determine a second processing level corresponding to a target emphasis for a second object in the image; control a first shielding rate of the light shielding unit in a first object area corresponding to the first object based on the first processing level; and control a second shielding rate of the light shielding unit in a second object area corresponding to the second object based on the second processing level.

In one embodiment, the processing unit is configured to control the first shielding rate of the light shielding unit in the first object area to be higher than the second light shielding rate of the light shielding unit in the second object area responsive to the target emphasis for the first object being higher than the target emphasis for the second object.

In one embodiment, the processing unit is configured to compare characteristics of the first object and the second object and determine the first processing level for the first object responsive to the comparison of the characteristics. The processing unit may also determine the second processing level for the second object relative to the first processing level for the first object.

In one embodiment, the first object includes a plurality of sub-objects, and the processing unit determines sub-processing levels corresponding to target emphasis for the sub-objects and controls a plurality of shielding rates of the light shielding unit in sub-object areas corresponding to the sub-objects based on the sub-processing levels.

In one embodiment, the processing unit is configured to generate a depth map for the image and to determine the first processing level and the second processing level based on the depth map. Alternatively, the processing unit may be configured to generate a saliency map for the image and to determine the first processing level and the second processing level based on the saliency map.

In one embodiment, the processing unit is configured to adjust sharpness of at least one of the first object or the second object in the image such that one of the first object or the second object having the higher target emphasis is sharper than the other. In another embodiment, the processing unit is configured to adjust blurriness of at least one of the first object or the second object in the image such that one of the first object or the second object having the lower target emphasis is blurrier than the other. In a further embodiment, the processing unit is configured to adjust saturation of at least one of the first object or the second object in the image such that one of the first object or the second object having the higher target emphasis is more saturated than the other.

In one embodiment, a method of operation in a transparent display unit comprises determining a first processing level corresponding to a target emphasis for a first object and a second processing level corresponding to a target emphasis for a second object in an image to be displayed by light emitting material of a transparent display unit. The method further comprises controlling a first shielding rate of a light shielding unit in a first object area corresponding to the first object based on the first processing level and controlling a second shielding rate of the light shielding unit in a second object area corresponding to the second object based on the second processing level. In another embodiment a non-transitory computer readable medium stores instructions that when executed by a processor cause the processor to perform the method.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

The same reference marks over the description refer to the same components.

Although first, second, and the like are used in order to describe various components, the components are not limited by the terms. The above terms are used only to distinguish one component from the other component. Therefore, a first component mentioned below may be a second component within the technical spirit of the present invention.

Hereinafter, exemplary embodiments of the present invention will be described with reference to the accompanying drawings.

Figure 1:
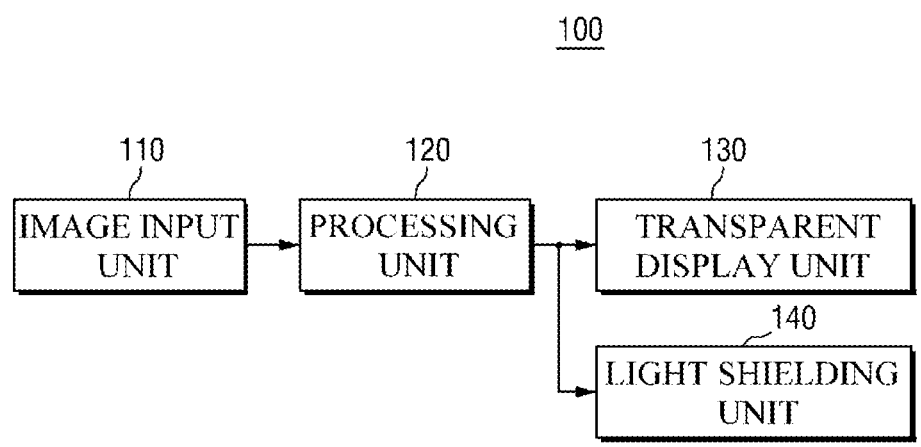
FIG. 1 is a block diagram of a transparent display apparatus including a processing unit according to an exemplary embodiment of the present invention.

FIG. 1 is a block diagram of a transparent display apparatus including a processing unit according to an exemplary embodiment of the present invention. A transparent display apparatus 100 means a display apparatus in which at least a partial area of a screen of the display apparatus that is seen by a user is transparent.

The transparent display apparatus 100 according to an exemplary embodiment of the present invention includes an image input unit 110, a processing unit 120, a transparent display unit 130, and a light shielding unit 140 overlapping the transparent display unit 130. The transparent display unit 130 displays an image, and the light shielding unit 140 adjusts transparency of the transparent display apparatus 100. In the transparent display apparatus 100 according to an exemplary embodiment of the present invention, the transparent display unit 130 and the light shielding unit 140 may be bonded to each other by an adhesive or glue, or may be positioned sufficiently close to each other so as to be driven as at least one transparent display apparatus 100.

The transparent display unit 130 of the transparent display apparatus 100 according to an exemplary embodiment of the present invention is a transparent organic light-emitting display device. The organic light-emitting display device is a display apparatus configured to cause an organic light-emitting material layer to emit light by allowing current to flow in the organic light-emitting layer. The transparent organic light-emitting display device emits light having a certain wavelength by using the organic light-emitting layer. The transparent organic light-emitting display device includes at least a cathode, the organic light-emitting layer, and an anode and may be divided into many light emitting pixels. The transparent organic light-emitting display device in the present specification means a display device in which a transparent organic light-emitting display device has a transmittance of at least 20% or more for external light, for example.

The transparent display unit 130 functions to output an image signal received from the processing unit 120.

The light shielding unit 140 functions to control a light shielding rate in response to a light shielding signal received from the processing unit 120. The light shielding unit 140 may selectively shield external light in a partial area of the light shielding unit 140, and the light shielding unit 140 may adjust a light shielding degree. For example, the light shielding unit 140 may shield 1% to 99% of external light entering from the rear side of the transparent display apparatus 100.

The light shielding unit 140 is configured to change a path of light entering from the rear side of the light shielding unit 140 by shielding, transmitting, scattering, or absorbing the light, or change a characteristic of the light, thereby shielding at least a portion of the light from passing through the transparent display unit 130.

The light shielding unit 140 of the transparent display apparatus 100 according to the exemplary embodiment of the present invention may be a charged particle light shielding unit capable of shielding light by the spread of charged particles. The charged particle light shielding unit may include at least a lower substrate, a collect electrode, fluid in which the charged particles can diffuse, a diffusion electrode, and an upper substrate. In the charged particle light shielding unit, an electric field is generated by a voltage applied to the electrode and the charged particles are moved along the electric field, so that the transmission or shield of light can be controlled.

In order to transmit light, the charged particle light shielding unit may generate an electric field so as to allow the charged particles to be collected into the collect electrode formed at a part of the lower substrate, and light entering the charged particle light shielding unit sequentially passes through the lower substrate, the fluid, and the upper substrate. Accordingly, a behind view of the transparent display apparatus 100 can be seen through an upper portion of the transparent display apparatus 100.

In order to shield light, the electric field may be generated so as to allow the charged particles to be collected into the diffusion electrode formed on the entire surface of the upper electrode, the light entering from the rear side may reach the charged particles spread over the entire surface of the upper substrate, and then the light that has reached the charged particles may be absorbed into the charged particles. Accordingly, the object on the back surface of the transparent display apparatus 100 cannot be seen through the upper portion of the transparent display apparatus 100.

In order to achieve a translucent state, in the charged particle light shielding unit, the charged particles are controlled by allowing an applying time or applying magnitude of a voltage to the collect electrode and/or the diffusion electrode to be different from each other. By doing this, the charged particles can be spread between the upper substrate and the lower substrate. A part of the light entering from the rear side passes through the charged particle light shielding unit, and the other part of the light entering from the rear side reaches the charged particles to be absorbed to the charged particles, so that the translucent state can be realized in the charged particle light shielding unit. The charged particle light shielding unit can adjust a light entering from the rear side degree by adjusting the applying time or applying magnitude of the voltage to the electrodes. Further, the light shielding unit 140 may a driving controller, and may be driven in a passive matrix and an active matrix.

The light shielding unit 140 of the transparent display apparatus 100 according to the exemplary embodiment of the present invention may be a micro electro mechanical system (MEMS) device. The MEMS device is configured of a substrate, a thin film layer, an air layer, and a reflective film layer, and in the MEMS device, an image is displayed according two states, such as an open state and collapsed state. When voltage is not supplied, the thin film layer in the MEMS device is separated and can selectively reflect, and when low voltage is supplied, electrostatic force is generated and the thin film layer moves, thereby absorbing all the light. In addition, the light shielding unit 140 of the transparent display apparatus 100 according to the exemplary embodiment of the present invention may be an electro wetting device and electro chromic device.

The transparent display unit 130 and the light shielding unit 140 may be independently driven, and the light shielding unit 140 may transmit or shield light so as to improve a stereoscopic effect of the image displayed by the transparent display unit 130.

The processing unit 120 receives the image from the image input unit 110, and calculates perspective from the image. Subsequently, the processing unit divides the image into a plurality of objects according to the perspective, and determines processing levels of the divided objects. Thereafter, the processing unit performs image processing on the divided objects on the basis of the determined processing levels, and determines a light shielding rate of the transparent display apparatus 100 on the basis of the determined processing levels. As such, the stereoscopic effect of the image is improved.

The image means a visual image, and means all elements displayed on the screen or the display apparatus. The image may include a video, a still image, and a still cut. When the image is the video, the video may include a plurality of frames, and the frame may include a plurality of objects. The image may be a two-dimensional image or a three-dimensional image. Since the image processing is performed on both the two-dimensional image and the three-dimensional image, the two-dimensional image and the three-dimensional image are all referred to as the image in the following description, unless stated otherwise.

The object means a part of an image that can be divided from the image determined through an analysis of the input image, or an area or a layer including the part. The object may be divided by the perspective, characteristic, saliency, or boundary of the image.

The image processing means a process in which signal processing is performed on an input image signal through a processing unit or a processor to process the input image signal to be adapted to a purpose, and the image processing includes analog signal processing and digital signal processing. Hereinafter, for the sake of convenience in description, the image processing is the digital image processing on the image, but is not limited thereto. The image processing may be interpreted as a comprehensive meaning. Further, the image processing may include point processing, area processing, geometrical processing, and frame processing. The point processing processes each of pixels on the basis of positions of pixels. The area processing may change values of pixels on the basis of an original value of the pixel and a value of the pixel close to the pixel, and the geometrical processing may change positions or arrangements of pixels.

The frame processing may change values of pixels by an operation between two or more images.

A three-dimensional effect means that the image processing is performed on the input image by taking account of cognitive engineering or psychological elements or the stereoscopic effect of the image is enhanced by controlling the light shielding unit. For example, the transparent display apparatus simultaneously shows the input image displayed on the transparent display apparatus and the background transmitted through the transparent display apparatus. That is, the transparent display apparatus displays an image of two layers of images that are spatially divided, and consequently, the user feels a spatial stereoscopic effect by the two layers when viewing the transparent display apparatus. That is, the three-dimensional effect is the same as the principle in which when viewing an ambient environment through a glass window on which a character is written, the user feels the stereoscopic effect by distinguishing between the character written on the glass window and a background projected through the glass window. The present invention is to further enhance a stereoscopic effect characteristic of the transparent display apparatus through the image processing and the control of the light shielding unit. That is, when the stereoscopic effect of the image of the transparent display apparatus is enhanced by varying the image of the transparent display apparatus, an output image displayed in the transmissive area of the transparent display apparatus is displayed to be superior in the stereoscopic effect to the background transmitted through the transparent display apparatus.

In order to improve the stereoscopic effect, the processing unit 120 performs the image processing on the objects so as to adjust the stereoscopic effect of the objects in the image. The stereoscopic effect may be adjusted by taking account of cognitive engineering of human and psychological point of view. For example, the stereoscopic effect may be adjusted by varying sharpness, brightness, and saturation of a specific object in the image.

Further, even though an object such as a car exists in the image, the stereoscopic effect varies depending on sharpness of the car. That is, the processing unit 120 adjusts the stereoscopic effect by performing the image processing such that texture of the object is sharpened by increasing the sharpness as the object is positioned closer to the fore part in the image and performing the image processing such that the texture of the object is blurred as the object is positioned closer to the rear part in the image. Here, the fore part and the near part mean a spatial arrangement relation between objects in the image. The object arranged at the foremost in the image is an object having the highest perspective level determined by an analysis result of the image, and the object arranged at the rearmost in the image is an object having the perspective of the lowest level determined by the analysis result of the image.

Furthermore, even though an object such as a car exists in the image, the user feels differently about the stereoscopic effect depending on brightness of the car. That is, the processing unit 120 adjusts the stereoscopic effect by performing the image processing on the objects such that brightness of the object increases as the object is positioned closer to the fore part and by performing the image processing on the objects such that the brightness of the object decreases as the object is positioned closer to the rear part.

Moreover, even though an object such as a car exists in the image, the user feels differently about the stereoscopic effect depending on saturation of the car. That is, the processing unit 120 adjusts the stereoscopic effect by performing the image processing on the objects such that saturation of the object increases as the object is positioned closer to the fore part and by performing the image processing on the objects such that the saturation of the object decreases as the object is positioned closer to the rear part.

The processing unit 120 processes an image signal for displaying the image and generates a light shielding signal for controlling the light shielding unit 140. The processing unit 120 sends the processed image signal to the transparent display unit 130 and sends the light shielding signal to the light shielding unit 140.

The light shielding unit 140 adjusts contrast ratios of the plurality of objects included in the image displayed on the transparent display apparatus in response to the light shielding signal.

The contrast ratio of the object gradually decreases as the light shielding rate decreases, and the sharpness, brightness, and saturation vary. That is, as the light shielding rate decreases, the object is viewed to be blurred, and the saturation decreases. Thus, the light shielding unit 140 can emphasize the stereoscopic effect as if the object is positioned at the rear part.

As the light shielding rate increases, the contrast ratio of the object gradually increases, and the contrast ratio of the object increases. Thus, the light shielding unit 140 can emphasize the stereoscopic effect as if the object is positioned at the fore part. Accordingly, the processing unit 120 can adjust the stereoscopic effect of the object by controlling the light shielding unit 140 depending on the processing level of the object.

Figure 2:
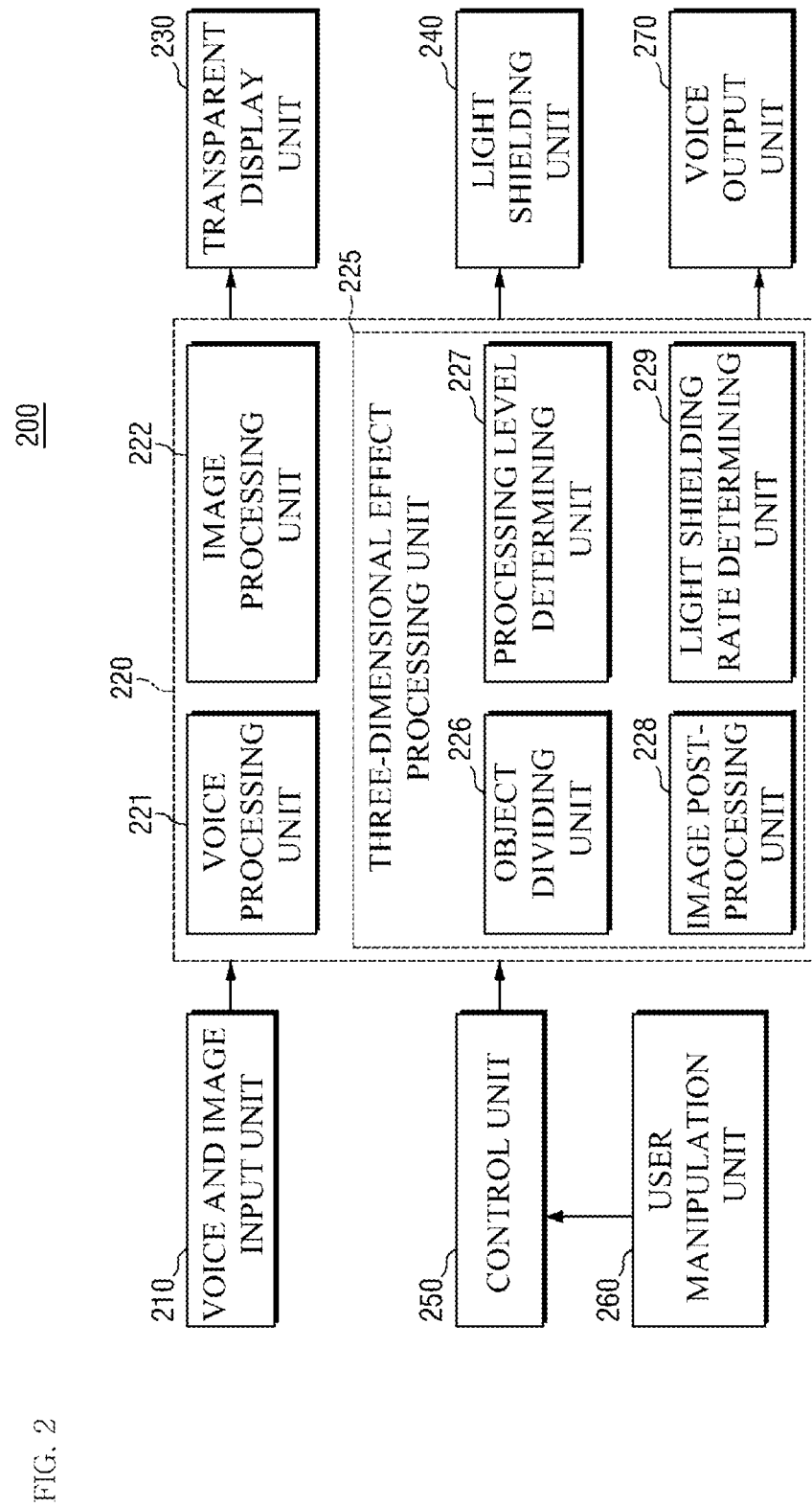
FIG. 2 is a block diagram for describing a function of a transparent display apparatus according to an exemplary embodiment of the present invention.

FIG. 2 is a block diagram for describing a function of a transparent display apparatus according to an exemplary embodiment of the present invention. A transparent display apparatus 200 according to the exemplary embodiment of the present invention includes a voice and image input unit 210, a processing unit 220, a transparent display unit 230, a light shielding unit 240, a control unit 250, a user manipulation unit 260, and a voice output unit 270.

The processing unit 220 includes a voice processing unit 221, an image processing unit 222, and a three-dimensional effect processing unit 225.

The three-dimensional effect processing unit 225 includes an object dividing unit 226, a processing level determining unit 227, an image post-processing unit 228, and a light shielding rate determining unit 229.

The voice and image input unit 210 receives a voice or an image to input the received voice or image to the processing unit 220. The user manipulation unit 260 receives an input from a user. The voice output unit 270 receives a voice signal from the voice processing unit 221 to output the voice.

The control unit 250 controls an operation of a system of the transparent display apparatus 200. The system may further include an OS (Operating System). The OS provides a plurality of modes for providing effects of the present invention.

The light shielding unit 240 may be driven in a translucent mode in which only a part of light is shielded, a transparent mode in which light is transmitted as much as possible, and a shielding mode in which light is shielded as much as possible, and the translucent mode may include at least one or more translucent levels.

The plurality of modes includes a mode in which a three-dimensional effect is added to the image. The control unit 250 controls the three-dimensional effect processing unit 225 to perform a process for improving the stereoscopic effect or the visibility. In the three-dimensional effect adding mode, it is possible to maintain the visibility of the input image while adding the three-dimensional effect to the image.

The voice processing unit 221 performs signal processing such as decoding, noise removing, or normalizing on the input voice.

The image processing unit 222 performs signal processing such as decoding, noise removing, contrast adjusting, and image scaling on the input image. The image processing unit 222 performs a process on an image signal and a light shielding control signal to be time-synchronized, and the time-synchronization is determined based on a response time of the light shielding unit 240.

The three-dimensional effect processing unit 225 receives an image according to a command from the control unit 250 or a setting that is previously stored, and calculates the perspective from the received image. Subsequently, the three-dimensional effect processing unit divides the image into a plurality of objects in consideration of the perspective, and determines processing levels of the plurality of divided objects that represent target amounts of emphasis for the objects. Thereafter, the three-dimensional effect processing unit performs the image processing on the objects on the basis of the determined processing levels, and determines a light shielding rate of the transparent display unit 200 on the basis of the determined processing levels. The three-dimensional effect processing unit 225 outputs the processed image signal to the transparent display unit 230. The three-dimensional effect processing unit 225 generates a light shielding control signal for controlling the light shielding unit 240 on the basis of the determined light shielding rate and outputs the generated light shielding control signal to the light shielding unit 240. Controlling a shielding rate of an area of the light shielding unit 240 includes determining a light shielding rate of the transparent display apparatus 200 by the three-dimensional effect processing unit 225 and generating the light shielding signal for controlling the light shielding unit 240 on the basis of the determined light shielding rate. The light shielding control signal may be generated based on a look-up table. For example, a light shielding signal of a certain level may be assigned to each of light shielding rates, and the light shielding signal may be a light shielding signal of 2n (n is a natural number) levels, for example, 16 levels or 256 levels. Furthermore, an applying voltage value or an applying time value may be differently determined for each level of the light shielding signal.

First, the object dividing unit 226 of the three-dimensional effect processing unit 225 determines a reference method for dividing the image received from the voice and image input unit 210 into a plurality of objects. The three-dimensional effect processing unit 225 may select one method of a plurality of reference methods, or may divide the image into the objects by a combination of the plurality of methods.

When the reference method for dividing the image into the objects is determined, the object dividing unit 226 of the three-dimensional effect processing unit 225 divides the image into the plurality of objects. The dividing of the image into the plurality of objects by the object dividing unit 226 of the three-dimensional effect processing unit 225 may be performed by various references.

In one embodiment, the object dividing unit 226 of the transparent display apparatus 200 according to the exemplary embodiment of the present invention divides the image into the objects on the basis of the perspective from the image.

In another embodiment, the object dividing unit 226 of the transparent display apparatus 200 according to the exemplary embodiment of the present invention divides the image into the objects on the basis of the saliency of the image instead of the perspective from the image.

The processing level determining unit 227 of the three-dimensional effect processing unit 225 determines the processing levels of the plurality of divided objects. The processing level is a unit for distinguishing the plurality of objects and represents a target amount of emphasis for the objects. The plurality of objects may have the same processing level, or may have different processing levels.

An image processing method or a degree of image processing may be different depending on the processing level of the object. The lowest degree of processing may include not performing any image processing at all. Moreover, light shielding rates of areas corresponding to the objects may be different depending on the processing levels of the objects.

The processing level determining unit 227 of the three-dimensional effect processing unit 225 takes account of a fact that the object has a lower saturation or sharpness as the object is positioned closer to the rear part of the image. The processing level determining unit 227 compares saturation levels or sharpness levels of the plurality of divided objects with each other to determine the object having the highest saturation level or the highest sharpness level as a reference object. In addition, the processing level determining unit 227 may analyze a position in the image that is in focus on the basis of the saturation or sharpness levels of the plurality of objects to obtain focal information and determine a reference object by using the focal information.

One object may include a plurality of sub-objects. For example, areas having different perspective levels within the same object are distinguished to be determined as sub-objects. Different kinds of image processing may be performed on the sub-objects, and different light shielding rates may be determined for the sub-objects. The plurality of sub-objects may be, for example, an object such as a wide field in a scene image. Since a boundary is clear at the periphery area of the field, the object is easily identified from the image, whereas since image information gradually varies at the inner part of the field, it is difficult to distinguish between the plurality of sub-objects within the field.

In order to determine whether or not the object is divided into the sub-objects, characteristics of the objects are analyzed. The processing level determining unit 227 calculates an area of the object. When the area of the object is equal to or greater than a preset reference area, the object is determined as an object that can be divided into sub-objects. The processing level determining unit 227 analyzes the characteristic of the object for dividing the object having the preset area or more into the sub-objects. The characteristic analysis may include a saturation change analysis, an area analysis, a sharpness change analysis, a shape analysis, and a gradation change analysis. The processing level determining unit 227 determines the sub-objects depending on a changing degree of the saturation, area, sharpness, shape, and gradation. More specifically, a general nature scene image has a characteristic that as the object is positioned farther from a viewer, any one value of the sharpness and gradation decreases.

The processing level may include sub-processing levels. For example, the sub-objects in the same object may have different sub-processing levels. Different kinds of image processing may be performed for the sub-processing levels, and different light shielding rates may be determined for the sub-processing levels.

The image post-processing unit 228 of the three-dimensional effect processing unit 225 performs the image processing on the objects on the basis of the processing levels of the divided objects. An image processing method for the object performed by the image post-processing unit 228 may include blurring, sharpening, and color saturation control. The image post-processing unit 228 of the three-dimensional effect processing unit 225 performs the image processing on the image according to the determined processing levels so as to provide the stereoscopic effect.

In one embodiment, the image post-processing unit 228 may provide the stereoscopic effect to the object by adjusting only a blurring level according to the processing levels.

In another embodiment, the image post-processing unit 228 may provide the stereoscopic effect to the object by adjusting only a sharpening level according to the processing levels.

In a further embodiment, the image post-processing unit 228 may provide the stereoscopic effect to the object by adjusting only a color saturation control level according to the processing levels.

The light shielding rate determining unit 229 of the three-dimensional effect processing unit 225 determines light shielding rates of the objects on the basis of the processing levels of the divided objects. The light shielding rate determining unit 229 relatively compares the processing levels of the plurality of objects to determine the light shielding rates. The light shielding rate determining unit 229 determines the shielding rates such that light shielding rates of objects having relatively higher processing levels are higher than light shielding rates of objects having relatively lower processing levels. Thus, processing levels corresponding to higher levels of target emphasis thus result in higher light shielding rates. Processing levels corresponding to lower levels of target emphasis result in lower light shielding rates.

The light shielding rate determining unit 229 of the transparent display apparatus 200 according to the exemplary embodiment of the present invention determines the light shielding rates of the objects by providing the same shielding level or different shielding levels depending on the processing levels of the objects.

That is, the light shielding rate of the object may be determined as shielding levels corresponding to the look-up table according to preset shielding rates. For example, when the light shielding rate of the object is determined as 0%, the shielding level may be a zero level, and when the light shielding rate is determined as 1% to 10%, the shielding level may be a first level.

In the transparent display apparatus 200 according to the exemplary embodiment of the present invention, by increasing, for example, a shielding rate of an object having a high processing level, external light of a rear surface of the object is blocked, so that it is possible to improve visibility of the object, and to emphasize a stereoscopic effect of the object. Further, by setting a shielding rate of an object having a low processing level to be lower than that of an adjacent object, the external light on the rear surface is mixed with the object, and saturation and sharpness are decreased, so that the object appears to be farther from the viewer.

The processing unit 220 is functionally divided into different processing units for the sake of convenience in description, and parts or all of blocks or modules included in the processing unit 200 may be separated from each other, or combined to each other. The processing unit may be variously implemented.

The transparent display unit 230 receives an image signal to display an image. The transparent display unit 230 displays the image in an emissive area, and transmits light in a transmissive area. The emissive area is an area where an actual image is displayed, and the transmissive area is an area where external light from the back surface of the transparent display apparatus 200 is transmitted to project an object from the back surface. The image in the emissive area and the background through the transmissive area can be simultaneously seen through the transparent display apparatus 200.

Figure 3:
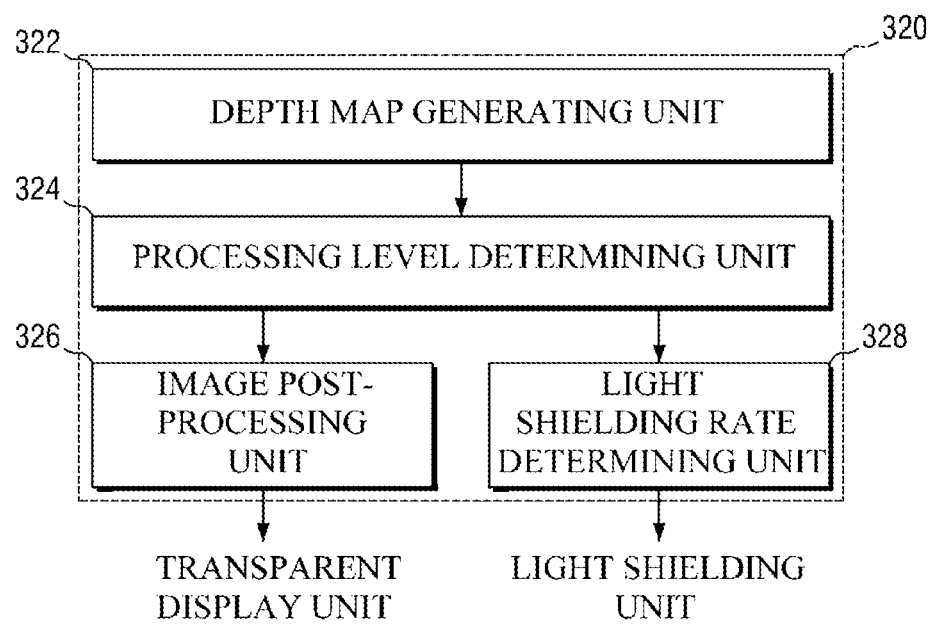
FIG. 3 is a block diagram of a processing unit of a transparent display apparatus according to an exemplary embodiment of the present invention.

FIG. 3 is a block diagram of a processing unit of a transparent display apparatus according to an exemplary embodiment of the present invention.

Referring to FIG. 3, a processing unit 320 includes a depth map generating unit 322, a processing level determining unit 324, an image post-processing unit 326, and a light shielding rate determining unit 328. The processing unit 320 may perform pre-processing on an input image before sending the image to the depth map generating unit 322. The pre-processing may include decoding, screen scaling, resizing, de-interlacing, and noise removing.

The depth map generating unit 322 generates a depth map including perspective information of the image for dividing the image in the objects, and divides the image into a plurality of objects on the basis of the depth map. The depth map generating unit 322 corresponds to the object dividing unit 226 of FIG. 2.

The depth map means a map that represents a three-dimensional distance difference between objects included in a two-dimensional image. A depth value may be represented as a value of 2n (n is a natural number), for example, a value of 0 to 255, for each pixel of the image. As the value is large, the object appears at the fore part of the image. In general, an object at a lower side of the image may be regarded as being positioned closer to the viewer, the object may have a large value. However, the depth value may vary depending on an angle to be photographed or a subject to be represented.

The depth map generating unit 322 may generate the depth map by analyzing a characteristic of perspective of the image and analyzing a histogram characteristic in which edge directional properties are accumulated in the image. Further, the depth map generating unit 322 may generate the depth map by knowing a degree by which the image is tilted toward the left or the right according to the edge directional properties of upper and lower parts of the image and predicting a position of a vanishing point in the image. The depth map generating unit 322 may use only the generated depth map, or may use a combination of a plurality of depth maps. Alternatively, the depth map generating unit may generate the depth map by giving weighted values to the depth maps.

The depth map generating unit 322 divides the image into the plurality of objects on the basis of the generated depth map of the image. The method of dividing the image may be variously performed. For example, the depth map generating unit 322 may compare color information items with each other within the image to obtain boundary information between objects, obtain boundary information of a moving object by using a pixel difference for each frame of the image, and obtain boundary information of the object by using edge information of the image. The depth map generating unit 322 may use only the obtained boundary information, or may use a combination of a plurality of boundary information items. Otherwise, the depth map generating unit may combine the boundary information items by giving weighted values to the boundary information items.

The processing level determining unit 324 of the processing unit 320 determines processing levels of the plurality of divided objects. The processing level determining unit 324 may determine the processing levels of the plurality of objects on the basis of the generated depth map. For example, when the plurality of objects have different depth values, the processing unit 320 may determine a processing level of an object positioned at the foremost to be 16, and may determine a processing level of an object positioned at the rearmost to be 0.

Alternatively, the processing level determining unit 324 may determine a reference object among the plurality of objects and determine relative processing levels of the plurality of objects on the basis of the reference object. Here, the reference object may be determined based on the focal information items of the plurality of objects. For example, by comparing the saturation or sharpness levels of the plurality of objects with each other, an object having the highest saturation level or the highest sharpness level is determined as the reference object. Further, the processing level determining unit 324 may analyze a focal point in the image that is in focus by referring to the saturation and sharpness levels of the plurality of objects to obtain focal information items and determine the reference object by using the focal information items. The image post-processing unit 326 of the processing unit 320 may perform the image processing for providing the stereoscopic effect to the object on the basis of the determined processing levels. The light shielding rate determining unit 328 of the processing unit 320 may determine the shielding rate of the light shielding unit for each of the plurality of objects so as to provide the stereoscopic effect. In the three-dimensional effect processing unit 320 of the processing unit according to the exemplary embodiment of the present invention, the image processing for providing the stereoscopic effect is performed by taking account of a fact that the back surface of the transparent display apparatus is transparent.

The stereoscopic effect in the transparent display apparatus can be enhanced by taking into consideration visual factors such as focal adjustment, and experience based factors such as linear perspective or atmospheric perspective. The focal adjustment means that a sense of distance is recognized depending on a change in focal distance or a change in thickness of a retina.

The light shielding rate determining unit 328 of the processing unit 320 can improve the stereoscopic effect by determining the light shielding rates of the divided objects so as to adjust a focal point of an object positioned at a far distance due to the transparency of the transparent display unit itself. The user can see the back surface of the transparent display apparatus through the transparent display apparatus, and the user can perceive the perspective of the object on the back surface. The processing unit 320 performs the image processing on the image displayed on the transparent display apparatus, adjusts the light shielding rate for each of the objects of the image, and enhances perspective of the displayed image by using the perspective of the object on the back surface of the transparent display apparatus.

The processing unit 320 increases a light shielding rate of an object having a high processing level to cause the image to have an increased stereoscopic effect by the atmospheric perspective method. The processing unit 320 decreases a light shielding rate of an object having a low processing level to cause the image to have the stereoscopic effect by the atmospheric perspective method.

According to the atmospheric perspective method, there is a difference in clearness of the object depending on a distance to the object, and thus the user can perceive the stereoscopic effect. According to the atmospheric perspective method, an object close to the eye is presented with high sharpness and deep color, whereas an object farther from the eye is represented with high blurriness pale color. This effect accounts for the fact that there is a difference in the brightness or a difference in the color generated by an air layer between the eye and the object. That is, when the saturation or brightness of the object is adjusted and the clearness of a contour of the object is adjusted, it is possible to enhance the stereoscopic effect.

The image post-processing unit 326 can improve the stereoscopic effect of the object by performing the image processing based on the atmospheric perspective method on the plurality of objects. For example, the image post-processing unit 326 may perform the image processing on an object having a high processing level such that the object has warm advancing colors (e.g., red, yellow, orange). The image post-processing unit 326 can increase the saturation of the object by converting the image from a RGB (Red, Green, Blue) color space into a HSV (Hue, Saturation, Value) color space or another color space including saturation. The image post-processing unit 326 then increases a saturation value of the object. Otherwise, a color space including chromaticity as a concept similar to the saturation may be used.

In addition, in order to increase the sharpness of the object having a high processing level, the image post-processing unit 326 may process the image so as to allow the image to have a sharpened contour. The image post-processing unit 326 may increase the sharpness of the object by increasing a difference between pixel values of the object, specifically, pixel values in the boundary of the object. Further, the image post-processing unit 326 may process the image in order to increase the brightness of the object having a high processing level.

The image post-processing unit 326 may process the image so as to cause the object having a low processing level to have a cool receding color (e.g., blue, green, yellow). The image post-processing unit 326 may convert the image from the RGB color space into the HSV color space and reduce the saturation value of the object.

Further, in order to reduce the sharpness of the object having a low processing level, the image post-processing unit 326 may process the image so as to blur the object and the contour of the object. The image post-processing unit 326 may reduce the sharpness of the object by processing the image so as to allow pixel values of the object to be approximate to an average value thereof. Furthermore, the image post-processing unit 326 may process the image in order to reduce the brightness of the object.

The image post-processing unit 326 may perform the image processing such as a sharpening process for sharpening the contour, a blurring process for blurring the contour, or may perform image processing via brightness balance control, color saturation control, or gamma curve adjustment. The image processing may be adjusted within a range in which distortion is allowable. When the object has a plurality of sub-processing levels, different light shielding rates and different kinds of image processing may be applied for each of the sub-processing levels.

Furthermore, when the processing level determining unit 326 determines the processing levels of the plurality of objects relative to a reference object, the light shielding rate determining unit 328 determines a shielding rate of an area of the light shielding unit corresponding to the reference object as the highest shielding value. The light shielding rate determining unit 328 determines the light shielding rates of the other objects according to their relative processing levels.

Figure 4A:
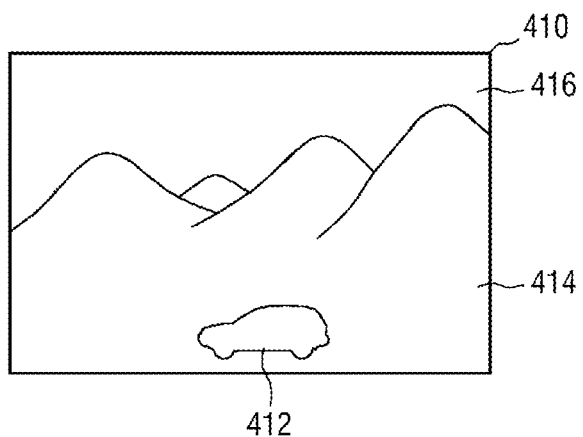
FIGS. 4A to 4F are schematic diagrams showing processing steps of the processing unit of the transparent display apparatus according to the exemplary embodiment of the present invention.

FIGS. 4A to 4F are schematic diagrams showing processing steps of the processing unit of the transparent display apparatus according to the exemplary embodiment of the present invention. FIG. 4A shows an input original image 410. The image 410 includes a first object 412, a second object 414, and a third object 416. The first object 412 depicts a car, the second object 414 depicts a series of mountains, and the third object 416 depicts the sky.

Figure 4B:
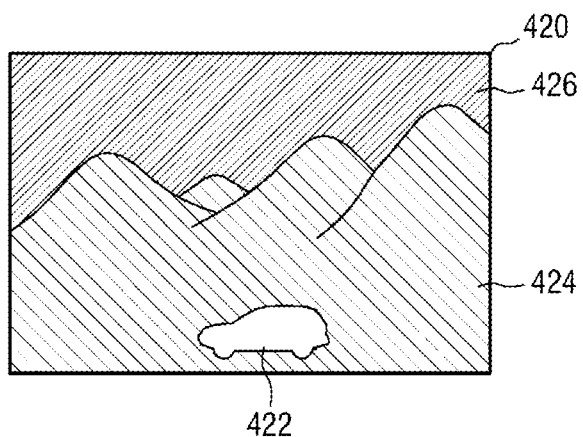

FIG. 4B illustrates a depth map of an image 420. As described above, the depth map may be represented as a value of 2n (n is a natural value), for example, a value of 0 to 255. For example, a large depth value may indicate that an object is positioned closer to the front of the image and larger depth values are visualized in the depth map 420 with lighter shading. Since a car of a first object 422 of FIG. 4B is positioned at the foremost of the image, the first object has a large depth value, and the first object appears with light shading in the depth map 420. Since a series of mountains of a second object 424 are positioned behind the first object 422, the second object 424 has an intermediate depth value, and the second object appears with gray shading in the depth map 420. Since the sky of a third object 426 is the farthest background, the third object has a low depth value, and the third object appears with dark shading in the depth map 426.

Figure 4C:
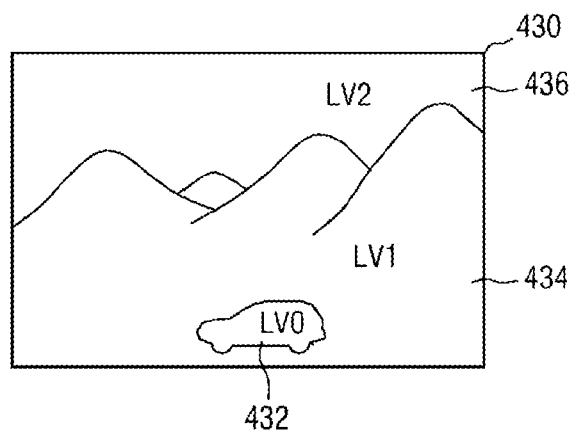

FIG. 4C illustrates that objects are divided based on a depth map of an image 430 and processing levels of the objects are determined. A first object 432 of FIG. 4C is determined to have a processing level of zero (LV0), a second object 434 is determined to have a processing level of one (LV1), and a third object 436 is determined as a processing level of two (LV2).

Figure 4D:
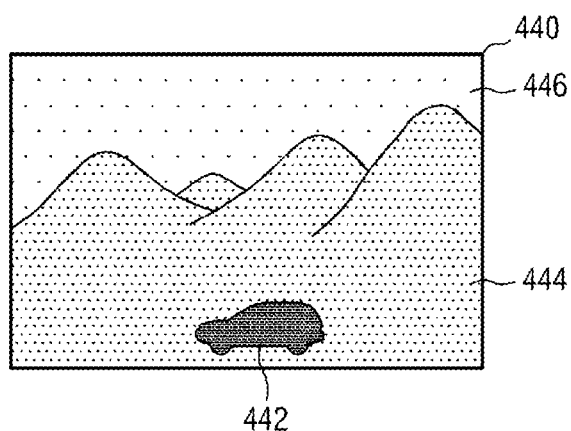

FIG. 4D illustrates that the image processing is performed on objects divided from an image 440 so as to allow the objects to have a stereoscopic effect. For example, a first object 442 of a processing level of zero is sharpened, and a contrast ratio thereof increases. Further, a color of the first object 442 is partially adjusted such that the first object 442 appears nearer than other objects. A second object 444 having a processing level of one and a third object 446 having a processing level of two are blurred, and contrast ratios thereof are decreased. Further, colors of the second 444 and third objects 446 are adjusted such that the second and third objects appear farther than the first object 442.

Figure 4E:
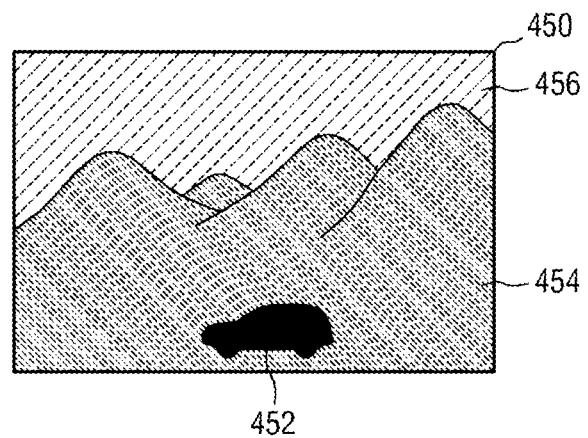

FIG. 4E illustrates light shielding rates determined for objects divided from an image 450. Since a first object 452 is a processing level of zero, the first object has the highest light shielding rate. Since a second object 454 is a processing level of one, the second object has an intermediate light shielding rate. Since a third object 456 is a processing level of two, the third object has the lowest light shielding rate.

Figure 4F:
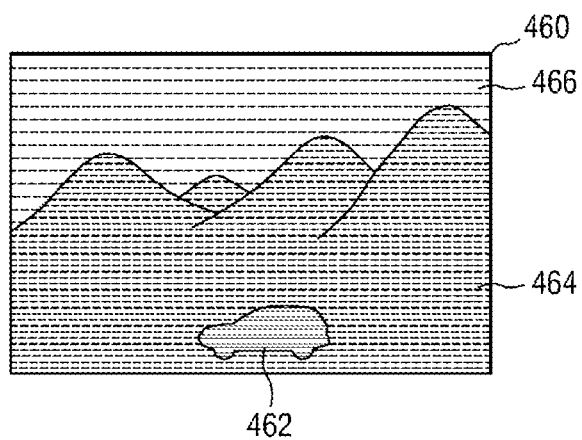

FIG. 4F illustrates an image 460 in which the image processing is performed on divided objects and light shielding rates of the objects are adjusted. The light shielding unit controls light shielding rates such that a first object 462, a second object 464, and a third object 466 have different light shielding rates from each other, and the transparent display unit displays the first object 462, the second object 464 and the third object 466 on which the image processing have been performed.

Figure 5:
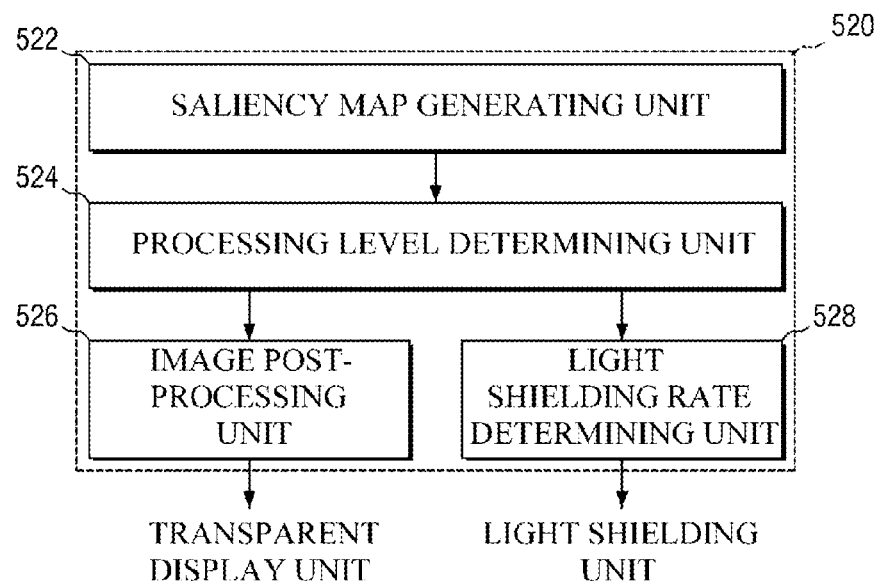
FIG. 5 is a block diagram of a processing unit of a transparent display apparatus according to an exemplary embodiment of the present invention.

FIG. 5 is a block diagram of a processing unit of a transparent display apparatus according to an exemplary embodiment of the present invention.

A processing unit 520 includes a saliency map generating unit 522, a processing level determining unit 524, an image post-processing unit 526, and a light shielding rate determining unit 528. The saliency map generating unit 522 generates a saliency map for dividing an image into a plurality of objects and divides the image into the plurality of objects on the basis of the saliency map. The saliency map generating unit 522 corresponds to the object dividing unit 226 of FIG. 2.

The saliency map may be referred to as a feature map, and represents concentration levels of attention generated in a salient object or a non-salient object as a map.

A visual system extracts only necessary information to efficiently process the extracted information instead of processing all images seen by eyes. The salient object may be a visual selection area of a part of the input image which is of the most interest. The salient object may be determined by visual attention characteristics. The determination of the salient object by visual attention characteristics may be performed by selecting only significant features in the image.

The salient object may be distinguished by salient factors represented by a spatial distribution of information within the image. That is, after various features of input images are extracted, the extracted features are combined to extract a feature indicating a degree of importance of several images among the images, and the salient object may be selected based on the extracted feature.

The method of extracting the salient object and setting the degree of importance thereof may be variously performed. The processing unit 520 may select any one method of a plurality of reference methods, or may use a combination of the plurality of methods. Alternatively, the processing unit 520 may perform the image processing on the objects by using one preset method and determine the light shielding rates of the objects.

In the saliency map, a saliency value may be represented as a value of 2n (n is a natural value), for example, a value of 0 to 255, for each pixel of the image. The higher the value in the saliency map, the more saliency the object has. Although a central area of a screen or a moving area may have a large saliency value, the saliency value may be changed depending on an angle to be photographed or a subject to be represented.

The saliency map generating unit 522 may obtain the saliency map by analyzing features of the image such as color and shape and applying an importance filter to analyze the degree of importance corresponding to the features. The saliency map generating unit 522 may use only the obtained saliency map, or may use a combination of a plurality of saliency maps. Otherwise, the saliency map generating unit 522 may combine the saliency maps by giving weighed values to the saliency maps.

The processing level determining unit 524 determines processing levels of the plurality of divided objects. The processing level determining unit 524 determines the processing levels of the plurality of objects on the basis of the saliency map. For example, when the plurality of objects has different saliency values, an object having a high concentration level of attention is determined to have a processing level of ten, and an object having a low concentration level of attention is determined to have a processing level of zero. The plurality of objects may have the same processing level.

The image post-processing unit 526 of the processing unit 520 performs the image processing for providing the stereoscopic effect to the objects on the basis of the determined processing levels. The light shielding rate determining unit 528 of the processing unit 520 determines the light shielding rate of the light shielding unit for each of the plurality of objects so as to emphasize the stereoscopic effect and the saliency.

The processing unit 520 processes the image such that the light shielding rate of the object having a high processing level is increased, the light shielding rate of the object having a low processing level is decreased, and attention is suppressed.

The image post-processing unit 526 processes the image so as to cause the object having a high processing level (corresponding to high target emphasis) to have sharper contours and a great differences in the brightness. The contour may be sharpened during a sharpening process. The brightness mad by adjusted with brightness balance control or gamma curve adjustment. A change of color may be adjusted within a range in which distortion is allowable.

The image post-processing unit 526 processes the image so as to cause the object having a low processing level (corresponding to low target emphasis) to have a blurred contour and a low difference in the brightness. When the object has a plurality of sub-processing levels, different light shielding rates and different kinds of image processing may be applied for each sub-processing level. The image processing may be adjusted within a range in which distortion is allowable. When the object has a plurality of sub-processing levels, different light shielding rates and different kinds of image processing may be applied for each sub-processing level.

FIGS. 6A to 6F are schematic diagrams showing processing steps of the processing unit of the transparent display apparatus according to the exemplary embodiment of the present invention.

Figure 6A:
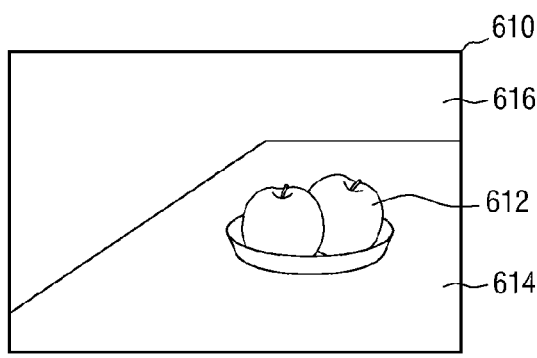
FIGS. 6A to 6F are schematic diagrams showing processing steps of the processing unit of the transparent display apparatus according to the exemplary embodiment of the present invention.

FIG. 6A illustrates an input original image 610. The image 610 includes a first object 612, a second object 614, and a third object 616. The first object 612 is apples, the second object 614 is a table, and the third object 616 is a background.

Figure 6B:
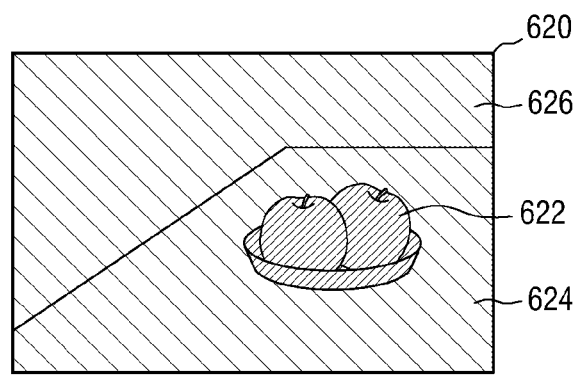

FIG. 6B illustrates a saliency map of an image 620. As stated above, in the saliency map, the saliency value may be represented as a value of 2n (n is a natural value), for example, a value of 0 to 255. As the saliency value is large, the object has higher saliency, and as the saliency value is large, the object appears with darker shading in the saliency map. It is assumed in FIG. 6B that a table and a background have the same saliency. Since apples of a first object 622 have the highest saliency value, the first object 622 appears with darker shading. Since the table of a second object 624 has a low saliency value, the second object appears with light shading in the saliency map. Since the background of a third object 626 has the same saliency value as that of the second object, the third object also appears with light shading in the saliency map. As mentioned above, FIG. 6B illustrates that the object appears with lighter or darker shading in the saliency map, but the saliency map may be different in other embodiments.

Figure 6C:
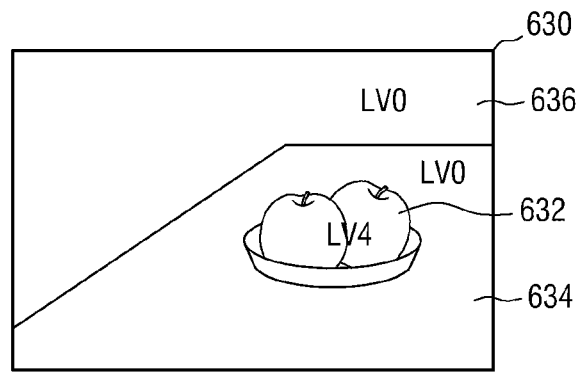

FIG. 6C illustrates that objects are divided based on a saliency map of an image 630 and processing levels of the objects are determined. A first object 632 of FIG. 6C is determined to have a processing level of four, and a second object 634 and a third object 636 are determined to have the same processing level of zero.

Figure 6D:
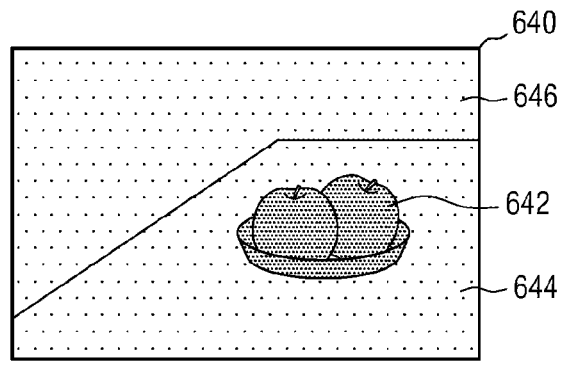

FIG. 6D illustrates image processing performed on objects divided from an object 640 so as to improve the stereoscopic effect. For example, a first object 642 having a processing level of four is sharpened, and a contrast ratio thereof increases. Further, a color of the first object is partially adjusted such that the first object 642 appears nearer than other objects. A second object 644 having a processing level of zero and a third object 646 having a processing level of zero are blurred, and contrast ratios thereof decrease.

Figure 6E:
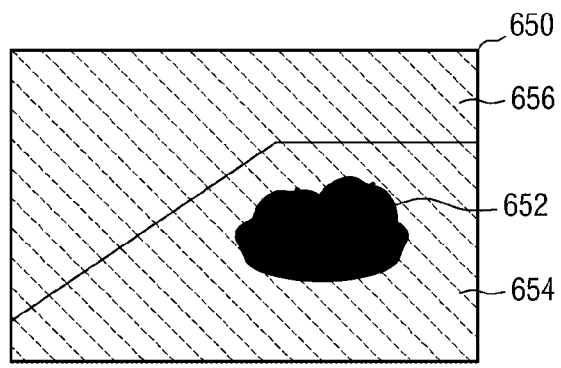

FIG. 6E illustrates light shielding rates determined for objects divided from an image 650. Since a first object 652 has a processing level of four, the first object 652 has the highest light shielding rate, and since a second object 654 and a third object 656 have the same processing level of zero, the second and third objects have a low light shielding rate.

Figure 6F:
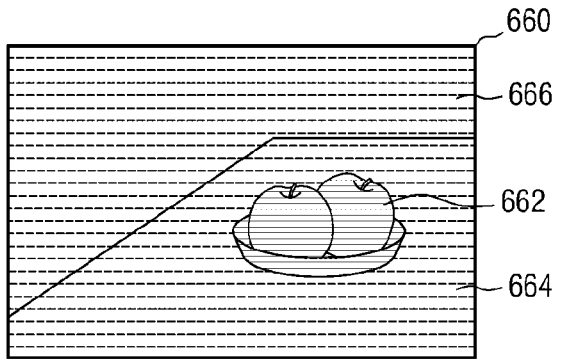

FIG. 6F illustrates an image in which the image processing is performed on objects divided from an image 660 and light shielding rates of the objects are adjusted. The light shielding unit controls light shielding rates such that a first object 662, a second object 664, and a third object 666 have different light shielding rates. The transparent display unit displays the first object 622, the second object 664, and the third object on which the image processing has been performed.

Figure 7:
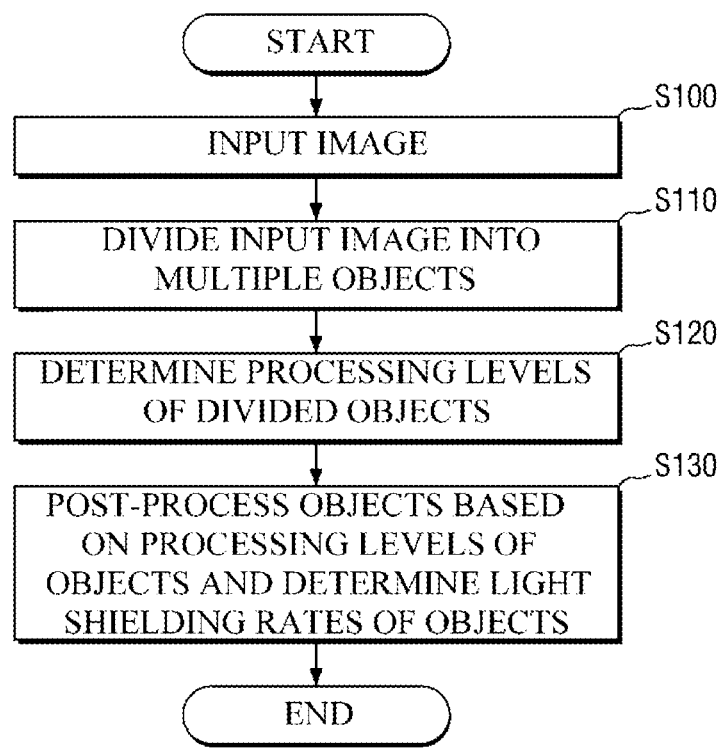
FIG. 7 is a flowchart of an image processing method according to an exemplary embodiment of the present invention.

FIG. 7 is a flowchart of an image processing method according to an exemplary embodiment of the present invention. Hereinafter, the description will be made with reference with the processing unit of the transparent display apparatus. Further, all steps may be independently performed, but may be described as one process in the following description for the sake of convenience in description.

The processing unit receives an image (S100). The processing unit divides the received image into a plurality of objects (S110). The processing unit may divide the image into the objects on the basis of the perspective, or may divide the image into the objects on the basis of the saliency.

Processing levels corresponding to target amounts of emphasis for the divided objects are determined (S120). The dividing of the image into the objects and the determination of the processing levels of the objects by the processing unit may be performed in the same step. The processing unit may generate a depth map on the basis of the perspective, divide the image into the plurality of objects and determines the processing levels according to the perspective of the depth map at the same time. The processing level determining unit may determine the processing levels of the objects on the basis of the method of dividing the image into the objects, or may determine the processing levels in a different method from the method of dividing the image into the objects.

The image processing is performed on the objects on the basis of the processing levels of the divided objects so as to enhance the stereoscopic effect of the object and light shielding rates of the objects are determined (S130).

The processing unit performs the image processing on the objects on the basis of the processing levels of the divided objects. The image processing method of the objects by the processing unit may be variously performed, and may include blurring and sharpening. The processing unit performs the image processing on the objects according to the determined processing levels so as to provide the stereoscopic effect to the objects. Further, the image post-processing unit of the three-dimensional effect processing unit performs the image processing on the objects according to the determining processing levels so as to improve the saliency.

The processing unit determines light shielding rates of the objects on the basis of the processing levels of the divided objects. The processing unit determines the light shielding rates such that light entering from the rear side of the transparent display apparatus is shielded for some of the objects and the light entering from the rear side is transmitted for other objects.

Figure 8:
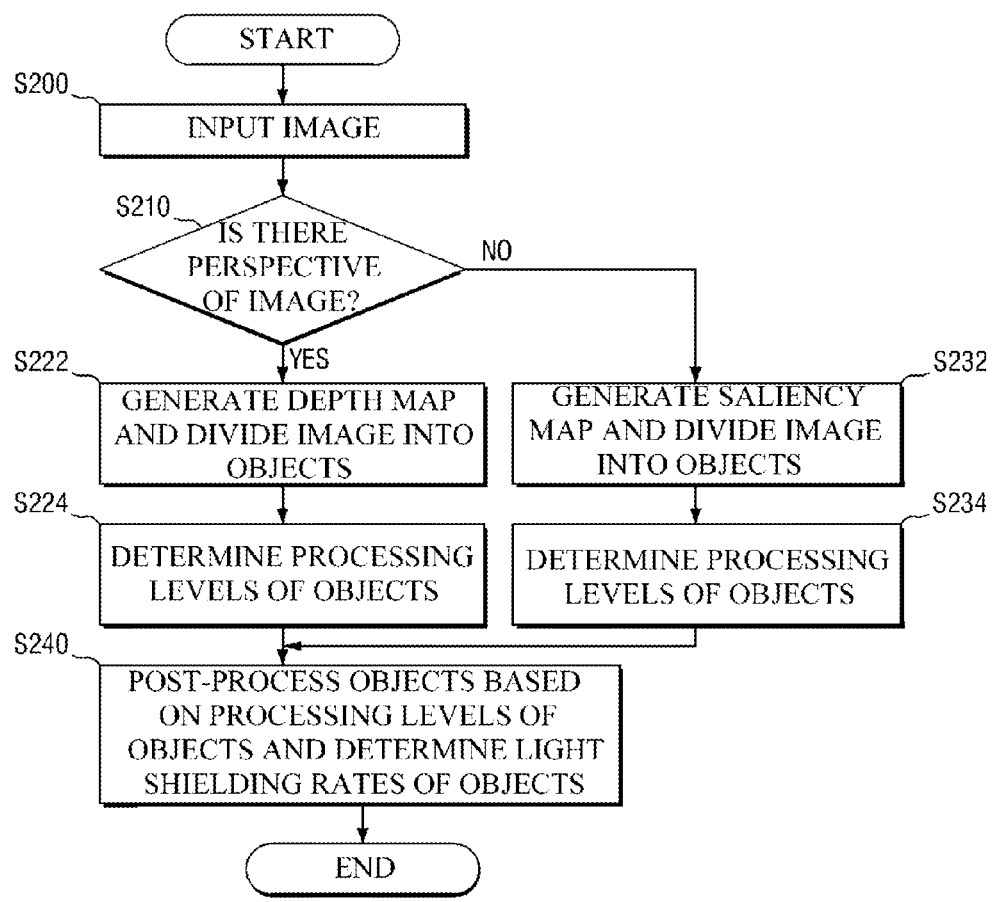
FIG. 8 is a flowchart of an image processing method according to an exemplary embodiment of the present invention.

FIG. 8 is a flowchart of an image processing method according to an exemplary embodiment of the present invention. Hereinafter, the description will be made with reference with the processing unit of the transparent display apparatus. Further, all steps may be independently performed, but may be described as one process in the following description for the sake of convenience in description.

The processing unit receives an image (S200). The processing unit determines a reference method for dividing the input image into a plurality of objects. For example, the image is divided into the objects on the basis of whether or not the image has more than a preset perspective value (S210). When the analyzed image has more than the preset perspective value, the image processing is performed on the objects on the basis of a depth map of the image. When the image has less than a preset perspective value, the image processing is performed on the objects on the basis of a saliency map of the image.

When the analyzed image has more than the preset perspective value, the processing unit generates the depth map for dividing the image into the plurality of objects, and divides the image into the plurality of objects on the basis of the depth map (S222). The processing unit determines processing levels of the plurality of objects on the basis of the generated depth map (S224).

When the image has less than the preset perspective value, the processing unit generates the saliency map for dividing the image into the plurality of objects, and divides the image into the plurality of objects on the basis of the saliency map (S232). The processing unit determines processing levels of the plurality of objects on the basis of the generated saliency map (S234).

The processing unit determines light shielding rates of the objects on the basis of the determined processing levels, and performs the image processing on the objects (S240).

Figure 9:
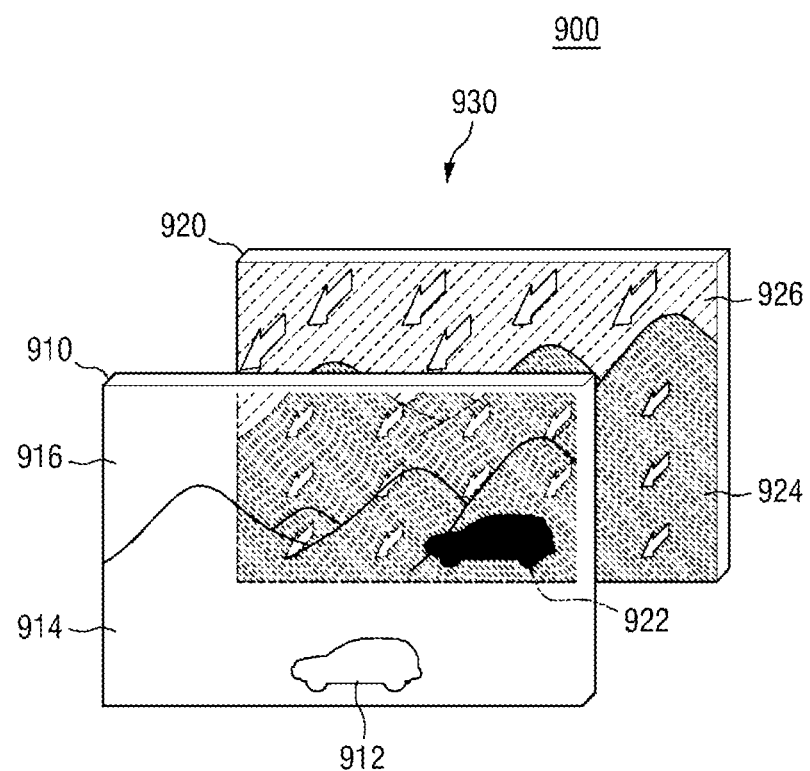
FIG. 9 is a schematic diagram of a transparent display apparatus according to an exemplary embodiment of the present invention.

FIG. 9 is a schematic diagram of a transparent display apparatus according to an exemplary embodiment of the present invention. FIG. 9 illustrates a transparent display apparatus 900 that displays the processed image by the processing unit according to the exemplary embodiment of the present invention.

The transparent display apparatus 900 includes a transparent display unit 910 and a light shielding unit 920. The transparent display unit 910 includes a first object 912, a second object 914, and a third object 916 on which the image processing has been performed. The light shielding unit 920 selectively shields light so as to allow the first object 912, the second object 914 and the third object 916 of the image to have different light shielding rates. For example, the image processing is performed to sharpen the first object 912 and 922 and shield light for the first objects 912 and 922 as much as possible. Accordingly, the first objects 912 and 922 are displayed so as to appear the closest. For example, the image processing is performed to a low amount of blurring the second objects 914 and 924, and light is shielded for the second objects 914 and 924 in an intermediate level. The third objects 916 and 926 are blurred at a high level, and light is not actually shielded. That is, the second objects 914 and 924 and the third objects 916 and 926 are processed to have the stereoscopic effect. The light enters the back surface of the transparent display apparatus 900, and the light is transmitted through the second objects 914 and 924 and the third objects 916 and 926 to be seen by the user. It is possible to improve the stereoscopic effect of the second objects 914 and 924 and the third objects 916 and 926 by this light seen by the user.

Hereinafter, various characteristics of the transparent display apparatus according to the present invention will be described.

According to another characteristic of the present invention, in the controlling light shielding rates of areas of a light shielding unit corresponding to the plurality of objects on the basis of the processing levels, the processing levels of the plurality of objects are relatively compared with each other, light shielding rates of areas of the light shielding unit corresponding to objects having relatively higher processing levels are controlled to be lowered than light shielding rates of areas of the light shielding unit corresponding to objects having relatively lower processing levels.

According to still another characteristic of the present invention, in the controlling light shielding rates of areas of a light shielding unit corresponding to the plurality of objects on the basis of the processing levels, the light shielding rates of the areas of the light shielding unit corresponding to the plurality of objects are controlled based on preset light shielding rates corresponding to the processing levels.

According to still another characteristic of the present invention, the determining processing levels of the plurality of objects includes determining a reference object among the plurality of objects; and determining relative processing levels of the plurality of objects on the basis of the reference object.

According to still another characteristic of the present invention, the determining a reference object among the plurality of objects includes determining the reference object on the basis of focal information items of the plurality of objects.

According to still another characteristic of the present invention, the controlling light shielding rates of areas of a light shielding unit corresponding to the plurality of objects on the basis of the processing levels includes: controlling a light shielding rate of an area of the light shielding unit corresponding to the reference object to become the lowest value; and controlling light shielding rates of areas of the light shielding unit corresponding to the other objects on the basis of the relative processing levels of the other objects.

According to still another characteristic of the present invention, the image processing method further includes: analyzing characteristics of the plurality of objects to divide at least one object of the plurality of objects into a plurality of sub-objects; determining processing levels of the plurality of sub-objects of the at least one object; and controlling shielding rates of areas of the light shielding unit corresponding to the plurality of sub-objects of the at least one object on the basis of the processing levels.

According to still another characteristic of the present invention, in the analyzing characteristics of the plurality of objects to divide at least one object of the plurality of objects into a plurality of sub-objects, at least one characteristic of saturation, area, sharpness, and gradation of the plurality of objects is analyzed.

According to still another characteristic of the present invention, in the determining processing levels of the plurality of objects, a depth map according to perspective values of the plurality of objects is generated, and the processing levels of the plurality of objects are set based on the depth map.

According to still another characteristic of the present invention, in the determining processing levels of the plurality of objects, when each of the plurality of objects has a perspective of a predetermined value or less, a saliency map is generated, and the processing levels of the plurality of objects are reset based on the saliency map.

According to still another characteristic of the present invention, the image processing method further includes processing the image so as to perform a blurring process on at least one object of the plurality of objects or a sharpening process on the least one object on the basis of the processing levels; and outputting the processed image to a transparent display unit.

According to still another characteristic of the present invention, the processing unit is configured to relatively compare the processing levels, and control shielding rates of areas of the light shielding unit corresponding to objects having relatively higher processing levels to be lower than shielding rates of areas of the light shielding unit corresponding to objects having relatively lower processing levels.

According to still another characteristic of the present invention, the processing unit is configured to control the shielding rates of the areas of the light shielding unit corresponding to the plurality of objects on the basis of preset shielding rates corresponding to the processing levels.

According to still another characteristic of the present invention, the processing unit is configured to determine a reference object among the plurality of objects, and determine relative processing levels of the other objects on the basis of the reference object.

According to still another characteristic of the present invention, the processing unit is configured to determine the reference object on the basis of focal information items of the plurality of objects.

According to still another characteristic of the present invention, the processing unit is configured to control a shielding rate of an area of the light shielding unit corresponding to the reference object to become the lowest value and control shielding rates of areas of the light shielding unit corresponding to the other objects on the basis of the relative processing levels of the other objects.

According to still another characteristic of the present invention, the processing unit is configured to analyze characteristics of the plurality of objects to divide at least one object of the plurality of objects into a plurality of sub-objects, determine processing levels of the plurality of sub-objects, and control shielding rates of the light shielding unit corresponding to the plurality of sub-objects on the basis of the processing levels.

According to still another characteristic of the present invention, the characteristics of the plurality of objects are at least one characteristic of saturation, area, sharpness, and gradation.

According to still another characteristic of the present invention, the processing unit generates a depth map according to perspective values of the plurality of objects, and sets the processing levels of the plurality of objects on the basis of the depth map.

According to still another characteristic of the present invention, the processing unit determines processing levels of the plurality of objects, generates a saliency map when each of the plurality of objects has a perspective of a predetermined value or less, and determines the processing levels of the plurality of objects on the basis of the saliency map.

According to still another characteristic of the present invention, the processing unit is configured to change the image so as to perform a blurring process on at least one object of the plurality of objects or a sharpening process on the least one object on the basis of the processing levels and output the changed image to the transparent display unit.

The components of various embodiments of the present invention can be partially or entirely bonded to or combined with each other and can be interlocked and operated in technically various ways as can be fully understood by an ordinary person skilled in the art, and the embodiments can be carried out independently of or in association with each other.

Combinations of each block of the accompanying block diagram and each step of the flow chart can be implemented by algorithms or computer program instructions comprised of firmware, software, or hardware. Since these algorithms or computer program instructions can be installed in processor of a universal computer, a special computer or other programmable data processing equipment, the instructions executed through a processor of a computer or other programmable data processing equipment generates means for implementing functions described in each block of the block diagram or each step of the flow chart. Since the algorithms or computer program instructions can be stored in a computer available or computer readable memory capable of orienting a computer or other programmable data processing equipment to implement functions in a specific scheme, the instructions stored in the computer available or computer readable memory can produce items involving an instruction means executing functions described in each block of the block diagram or each step of the flow chart. Since the computer program instructions can be installed in a computer or other programmable data processing equipment, a series of operation steps are carried out in the computer or other programmable data processing equipment to create a process executed by the computer such that instructions implementing the computer or other programmable data processing equipment can provide steps for implementing functions described in functions described in each block of the block diagram or each step of the flow chart.

Further, each block or each step may indicate a part of a module, a segment, or a code including one or more executable instructions for implementing specific logical function(s). Furthermore, it should be noted that in some alternative embodiments, functions described in blocks or steps can be generated out of the order. For example, two blocks or steps illustrated continuously may be implemented simultaneously, or the blocks or steps may be implemented in reverse order according to corresponding functions.

The steps of a method or algorithm described in connection with the embodiments disclosed in the present specification may be embodied directly in hardware, in a software module executed by a processor, or in a combination of the two. The software module may reside in RAM memory, flash memory, ROM memory, EPROM memory, EEPROM memory, register, hard disk, a removable disk, a CD-ROM, or any other form of storage medium known in the art. An exemplary storage medium is coupled to the processor such that the processor can read information from, and write information to, the storage medium. Otherwise, the storage medium may be integrated with the processor. The processor and the storage medium may reside in an application-specific integrated circuit (ASIC). The ASIC may reside in a user terminal. Otherwise, the processor and the storage medium may reside as discrete components in a user terminal.

The exemplary embodiments of the present invention have been described in more detail with reference to the accompanying drawings, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A transparent display apparatus comprising:
   a transparent display unit at a front side of the transparent display apparatus having an emissive area for display of an image and a transmissive area having a see-through characteristic, the transparent display unit being transparent to external light incident on the transparent display apparatus;
   a light shielding unit to shield at least a portion of the external light from passing through the transparent display unit, the light shielding unit disposed at a rear side of the transparent display apparatus; and
   at least one processing unit configured to:
      determine a first processing level corresponding to a target emphasis for a first object in the image;
      determine a second processing level corresponding to a target emphasis for a second object in the image;
      control a first shielding rate of the light shielding unit in a first object area corresponding to the first object based on the first processing level; and
      control a second shielding rate of the light shielding unit in a second object area corresponding to the second object based on the second processing level.

2. The transparent display apparatus according to claim 1, wherein the processing unit is configured to control the first shielding rate of the light shielding unit in the first object area to be higher than the second light shielding rate of the light shielding unit in the second object area responsive to the target emphasis for the first object being higher than the target emphasis for the second object.

3. The transparent display apparatus according to claim 1, wherein the processing unit is configured to determine the second processing level for the second object relative to the first processing level for the first object.

4. The transparent display apparatus according to claim 3, wherein the processing unit is configured to compare characteristics of the first object and the second object and determine the first processing level for the first object responsive to the comparison of the characteristics.

5. The transparent display apparatus according to claim 1, wherein the processing unit is configured to generate a depth map for the image and to determine the first processing level and the second processing level based on the depth map.

6. The transparent display apparatus according to claim 1, wherein the processing unit is configured to generate a saliency map for the image and to determine the first processing level and the second processing level based on the saliency map.

7. The transparent display apparatus according to claim 1, wherein the processing unit is configured to adjust sharpness of at least one of the first object or the second object in the image such that one of the first object or the second object having the higher target emphasis is sharper than the other.

8. The transparent display apparatus according to claim 1, wherein the processing unit is configured to adjust blurriness of at least one of the first object or the second object in the image such that one of the first object or the second object having the lower target emphasis is blurrier than the other.

9. The transparent display apparatus according to claim 1, wherein the processing unit is configured to adjust saturation of at least one of the first object or the second object in the image such that one of the first object or the second object having the higher target emphasis is more saturated than the other.

10. A method comprising:
   determining a first processing level corresponding to a target emphasis for a first object and a second object in an image to be displayed by an emissive area of a transparent display unit;
   controlling a first shielding rate of a light shielding unit in a first object area corresponding to the first object based on the first processing level and controlling a second shielding rate of the light shielding unit in a second object area corresponding to the second object based on the second processing level,
   wherein the transparent display unit includes the emissive area and a transmissive area and allows a user to see behind a transparent display apparatus through the transmissive area and also view the image emitted from the emissive area simultaneously, and wherein a front side of the transparent display apparatus is exposed to a user and the light shielding unit is disposed at a rear side of the transparent display apparatus.

11. The method of claim 10, wherein the first shielding rate of the light shielding unit in the first object area is controlled to be higher than the second light shielding rate of the light shielding unit in the second object area responsive to the target emphasis for the first object being higher than the target emphasis for the second object.

12. The method of claim 10, wherein the second processing level for the second object is determined relative to the first processing level for the first object.

13. The method of claim 12, further comprising:
   comparing characteristics of the first object and the second object,
   wherein the first processing level is determined responsive to the comparison of the characteristics.

14. The method of claim 10, further comprising:
   generating a depth map for the image,
   wherein the first processing level and the second processing level are determined based on the depth map.

15. The method of claim 10, further comprising:
   generating a salience map for the image,
   wherein the first processing level and the second processing level are generated based on the saliency map.

16. The method of claim 10, further comprising:
   adjusting sharpness of at least one of the first object or the second object in the image such that one of the first object or the second object having the higher target emphasis is sharper than the other.

17. The method of claim 10, further comprising:
   adjusting blurriness of at least one of the first object or the second object in the image such that one of the first object or the second object having the lower target emphasis is blurrier than the other.

18. The method of claim 10, further comprising:
   adjusting saturation of at least one of the first object or the second object in the image such that one of the first object or the second object having the higher target emphasis is more saturated than the other.

19. A non-transitory computer readable medium storing instructions, the instructions when executed by a processor cause the processor to perform a method comprising:

determining a first processing level corresponding to a target emphasis for a first object and a second object in an image to be displayed by an emissive area of a transparent display unit;

controlling a first shielding rate of a light shielding unit in a first object area corresponding to the first object based on the first processing level and controlling a second shielding rate of the light shielding unit in a second object area corresponding to the second object based on the second processing level, wherein the transparent display unit includes the emissive area and a transmissive area and allows a user to see behind the transparent display unit through the transmissive area and also view the image emitted from the emissive area simultaneously, and wherein a front side of a transparent display apparatus is exposed to a user and the light shielding unit is disposed at a rear side of the transparent display apparatus.

* * * * *